(12) United States Patent
Jonas et al.

(10) Patent No.: US 6,376,105 B1
(45) Date of Patent: Apr. 23, 2002

(54) ELECTROLUMINESCENT ARRANGEMENTS

(75) Inventors: Friedrich Jonas, Aachen; Andreas Elschner, Mülheim; Rolf Wehrmann, Krefeld, all of (DE); Dirk Quintens, Lier (BE)

(73) Assignee: Bayer Aktiengesellschaft, Leverkusen (DE)

( * ) Notice: Subject to any disclaimer, the term of this patent is extended or adjusted under 35 U.S.C. 154(b) by 0 days.

(21) Appl. No.: 09/147,425

(22) PCT Filed: Jul. 1, 1997

(86) PCT No.: PCT/EP97/03437

§ 371 Date: Dec. 21, 1998

§ 102(e) Date: Dec. 21, 1998

(87) PCT Pub. No.: WO98/01909

PCT Pub. Date: Jan. 15, 1998

(30) Foreign Application Priority Data

Jul. 5, 1996 (DE) ............................ 196 27 071

(51) Int. Cl.[7] .............................................. H05B 33/12
(52) U.S. Cl. ..................... 428/690; 428/704; 428/917; 313/504; 313/506; 257/103
(58) Field of Search ................. 428/690, 704, 428/917; 313/504, 506; 257/40, 103

(56) References Cited

U.S. PATENT DOCUMENTS

| | | | |
|---|---|---|---|
| 3,963,498 A | 6/1976 | Trevoy | 96/87 A |
| 4,539,507 A | 9/1985 | Vanslyke et al. | 313/504 |
| 4,720,432 A | 1/1988 | Vanslyke et al. | 428/457 |
| 4,769,292 A | 9/1988 | Tang et al. | 428/690 |
| 4,959,430 A | 9/1990 | Jonas et al. | 526/257 |
| 5,093,033 A | 3/1992 | Feldhues et al. | 252/500 |
| 5,126,214 A | 6/1992 | Tokailin et al. | 428/690 |
| 5,415,893 A | 5/1995 | Wiersma et al. | 427/385.5 |
| 5,498,761 A | 3/1996 | Wessling et al. | 427/542 |
| 5,766,515 A | 6/1998 | Jonas et al. | 252/500 |

FOREIGN PATENT DOCUMENTS

| | | |
|---|---|---|
| DE | 2 262 743 | 7/1973 |
| DE | 42 11 459 | 10/1993 |
| EP | 0 257 573 | 3/1988 |
| EP | 0 339 340 | 11/1989 |
| EP | 0 387 715 | 9/1990 |
| EP | 0 440 957 | 8/1991 |
| EP | 0 443 861 | * 8/1991 |
| EP | 0 532 798 | 3/1993 |
| EP | 0 589 529 | 3/1994 |
| EP | 0 643 118 | * 3/1995 |
| EP | 0 686 662 | 12/1995 |
| EP | 0 901 176 | * 3/1999 |
| WO | 90/04256 | 4/1990 |
| WO | 90/13148 | 11/1990 |
| WO | 95/24056 | * 9/1995 |
| WO | 96/08047 | * 3/1996 |
| WO | 98/05187 | * 2/1998 |

OTHER PUBLICATIONS

Bayer Product Information, Trial Product AI4071, PEDT/PSS, Sep. 1995, 7 pages.*

Y. Cao et al., "Polymer light–emitting diodes with polyethylene dioxythiophene–polystyrene sulfonate as the transparent anode", Synthetic Metals, vol. 87, No. 2, Mar 31, 1997, pp. 171–174.*

J. Am. Soc.; vol. 85; 1963; pp. 454–458, Kovacic et al., "Polymerization of Benzene to p–Polyphenyl . . . ". (no month).

Houben–Weyl; Methoden der organischen Chemie; vol. E20; Makromolekulare Stoffe; Teil 2; 1987; pp. 1141–1143. (no month).

* cited by examiner

*Primary Examiner*—Marie Yamnitzky
(74) *Attorney, Agent, or Firm*—Foley & Lardner

(57) ABSTRACT

Electroluminescing arrangement containing hole-injecting and/or electron-injecting layers, the polymeric organic conductors being chosen from the group consisting of polyfurans, polypyrroles, polyanilines, polythiophenes and polypyridines.

8 Claims, No Drawings

ELECTROLUMINESCENT ARRANGEMENTS

The invention relates to electroluminescing arrangements (devices) that contain conducting polymers as hole-injecting and/or electron-injecting layer.

An electroluminescing (EL) arrangement is characterised by the fact that it emits light when an electrical voltage is applied with flow of current. Such arrangements have been known for a long time in industry and technology under the description "light-emitting diodes" (LEDs). Light is emitted on account of the fact that positive charges (holes) and negative charges (electrons) combine with the emission of light.

All LEDs commonly used in industry and technology consist largely of inorganic semiconductor materials. However, for some years EL arrangements have been known whose basic constituents are organic materials.

These organic EL arrangements as a rule contain one or more layers of organic charge transport compounds.

The layer structure is in principle as follows. The numbers 1 to 10 denote the following:
1. Carrier, substrate
2. Base electrode
3. Hole-injecting layer
4. Hole-transporting layer
5. Emitter layer
6. Electron-transporting layer
7. Electron-injecting layer
8. Top electrode
9. Contacts
10. Covering, encapsulation.

This structure represents the most general case and can be simplified by omitting individual layers, so that one layer performs several tasks. In the simplest case an EL arrangement consists of two electrodes between which an organic layer is arranged, which fulfils all functions, including emission of light. Such systems are described for example in Application WO 9013148 based on poly-[p-phenylene vinylene].

In the production of large-surface, electroluminescing display elements at least one of the current-carrying electrodes 2 or 8 must consist of a transparent and conducting material.

Suitable as substrate 1 are transparent carriers such as glass or plastics films (for example polyesters such as polyethylene terephthalate or polyethylene naphthalate, polycarbonate, polyacrylate, polysulphone, polyimide foil).

The following are suitable as transparent and conducting materials:
  a) metal oxide, for example indium-tin oxide (ITO), tin oxide (NESA), etc.
  b) semi-transparent metal films, for example Au, Pt, Ag, Cu, etc.

In the applications according to the invention low molecular weight or oligomeric as well as polymeric materials may be used as emitter layer 5. The substances are characterised by the fact that they are photoluminescing. Accordingly, suitable substances are for example fluorescent dyes or fluorescing molecules and their reaction products forming oligomers or their incorporation into polymers.

Examples of such materials are coumarins, perylenes, anthracenes, phenanthrenes, stilbenes, distyryls, methines or metal complexes such as $Alq_3$, etc. Suitable polymers include optionally substituted phenylenes, phenylene vinylenes or polymers with fluorescing segments in the polymer side chain or in the polymer backbone. A detailed list is given in EP-A 532 798.

It has been found however in practice that in order to increase the luminance, electron-injecting or hole-injecting layers (3,4 and/or 6,7) must be incorporated into the electroluminescing assemblies.

A large number of organic compounds that transport charges (holes and/or electrons) are described in the literature. Mainly low molecular weight substances are used, which are for example vacuum evaporated in a high vacuum. A comprehensive survey of the classes of substances and their use is given for example in the following publications: EP-A 387 715, U.S. Pat. Nos. 4 539 507, 4,720,432 and 4,769,292.

A disadvantage is the deposition of the substances by high-vacuum evaporation. In order to simplify the production process of ELP displays it would be advantageous if the layers 3,4 and 6,7 could be produced by deposition from solution.

From EP-A 686 662 it is known to use special mixtures of conducting organic polymeric conductors such as 3,4-polyethylene dioxythiophene and polyhydroxy compounds or lactams as electrode 1 in ELP assemblies.

In Synthetic Metals 76 (1996) 141–143 poly-(3,4-ethylenedioxythiophene) is described also as an electrode in LEDs, reference being made to the fact that poly-(3,4-ethylenedioxythiopene) electrodes produce lower luminance values than indium-tin oxide (ITO) electrodes.

It has now surprisingly been found that pure polymeric organic conductors such as 3,4-polyethylenedioxythiopene as charge-injecting intermediate layer on transparent metal electrodes such as ITO produce luminance values in LEDs that are significantly superior to the LEDs with pure metal electrodes or pure conducting polymer electrodes. These layers can be prepared from solution or by direct polymerisation of the monomers corresponding to the polymeric organic conductors.

Suitable polymeric organic conductors are for example polyfurans, polypyrroles, polyanilines, polythiophenes or polypyridines. These are described for example in EP-A 257 573 (polyalkoxythiophenes), WO 90/04256 (polyanilines), EP-A 589 529 (pyrrole), DE-A 2 262 743 (oligoanilines).

Particularly suitable are neutral or cationic thiophenes of the formula (I)

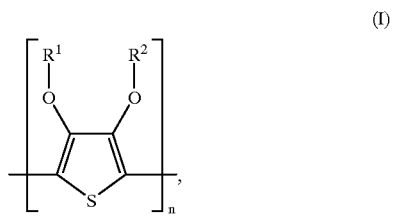

wherein
  $R^1$ and $R^2$ denote, independently of one another, hydrogen, optionally substituted $C_1$–$C_{20}$-alkyl, $CH_2OH$ or $C_6$–$C_{14}$-aryl, or
  $R^1$ and $R^2$ together denote —$(CH_2)_m$—$CH_2$— with m=0 to 12, preferably 1 to 5, or $C_6$–$C_{14}$-aryls, and n is an integer from 5 to 100.

$R^1$ and $R^2$ preferably denote —$(CH_2)_l$—$CH_2$— where l=1 to 4.

The polythiophenes with the repeating structural unit of the formula (I) are known (cf. EP-A 440 957 and 339 340). The preparation of the dispersions or solutions according to the invention is described in EP-A 440 957 and DE-OS 4 211 459.

The polythiophenes are used in dispersion or solution, preferably in cationic form, obtained for example by treating neutral thiophenes with oxidising agents. Conventional oxidising agents such as potassium peroxodisulphate are used for the oxidation. Through the oxidation the polythiophenes receive positive charges, which are not shown in the formulae since their number and position cannot be specified with certainty. According to the information given in EP-A 339 340 they can be produced directly on carriers.

The polyanions are anions of polymeric carboxylic acids, such as polyacrylic acids, polymethacrylic acids or polymaleic acids, and polymeric sulfonic acids, such as polystyrene sulfonic acids and polyvinyl sulfonic acids. These polycarboxylic and polysulfonic acids may also be copolymers of vinyl carboxylic and vinyl sulfonic acids with other polymerizable monomers, such as acrylates and styrene.

The molecular weight of the polyacids supplying the polyanions is preferably in the range from 1,000 to 2,000,000 and more preferably in the range from 2,000 to 500,000. The polyacids or their alkali salts are commercially available, for example polystyrene sulfonic acids and polyacrylic acids, or may be produced by known methods (cf. for example Houben-Weyl, Methoden der organischen Chemie, Vol. E20, Makromolekulare Stoffe, Teil 2, (1987), pp. 1141 et seq.).

Instead of the free polyacids required for the formation of the dispersions of polythiophenes and polyanions according to the invention, it is also possible to use mixtures of alkali salts of the polyacids and corresponding quantities of monoacids.

The polythiophene dispersions in the presence of polyanions according to the invention are obtained by oxidative polymerization of 3,4-dialkoxythiophenes corresponding to the following formula

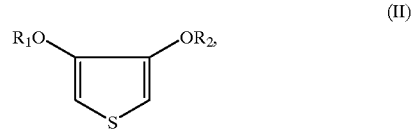

(II)

in which $R_1$ and $R_2$ are as defined for formula (I), with oxidizing agents typically used for the oxidative, polymerization of pyrrole and/or oxygen or air in the presence of the polyacids, preferably in aqueous medium, at temperatures of 0 to 100° C.

The polythiophenes get positive changes by the oxidative polymerization, which are not shown in the formula, because their number and position cannot be determined without doubt.

For polymerization, the thiophenes corresponding to formula (II), polyacid and oxidizing agent are dissolved in an organic solvent or—preferably—in water and the resulting solution is stirred at the polymerization temperature envisaged until the polymerization reaction is complete.

Where air or oxygen is used as the oxidizing agent, air or oxygen is introduced into the solution containing thiophene, polyacid and, optionally, catalytic quantities of metal salts until the polymerization reaction is complete.

The polymerization time may be between a few minutes and 30 hours, depending on the size of the batch, the polymerization temperature and the oxidizing agent. The polymerization time is generally between 30 minutes and 10 hours. The stability of the obtained dispersions may be improved by the addition of dispersing agents like sodium dodecyl sulphonate during or after polymerization.

Suitable oxidizing agents are any of the oxidizing agents suitable for the oxidative polymerization of pyrrole which are described, for example, in J. Am. Soc. 85, 454 (1963). For practical reasons, it is preferred to use inexpensive and easy-to-handle oxidizing agents, for example iron(III) salts, such as $FeCl_3$, $Fe(ClO_4)_3$ and the iron(III) salts or organic acids and inorganic acids containing organic residues, also $H_2O_2$, $K_2Cr_2O_7$, alkali or ammonium persulfates, alkali perborates, potassium permanganate and copper salts, such as copper tetrafluoroborate. In addition, it has been found that air and oxygen, optionally in the presence of catalytic quantities of metal ions, such as iron, cobalt, nickel, molybdenum and vanadium ions, may advantageously be used as oxidizing agents.

The process is described in more detail in EP-A 440 957 (=U.S. Pat. No. 5,300,575).

The invention accordingly aims to provide electroluminescing arrangements that contain hole-injecting and/or electron-injecting layers formed from the aforementioned polymeric organic compounds.

The object of the invention is also the use of the aforementioned polymeric organic compounds as hole-injecting and/or electron-injecting substances.

The intermediate layers can be deposited from solution onto the base electrode 2 and/or the emitter layer 5.

To this end in the systems according to the invention a solution of the 3,4-polyethylenedioxythiophene for example is deposited in the form of a film on the base electrode. Water or water/alcohol mixtures are preferably used as solvents. Suitable alcohols are for example methanol, ethanol, propanol and isopropanol.

The use of these solvents has the advantage that further layers of organic solvents, such as aromatic or aliphatic hydrocarbon mixtures, can then be deposited without attacking the layer 3,4. The same is true as regards the application of the layers 6,7 to the emitter layer 5.

The solution of the polymeric organic conductor is uniformly deposited over the substrate by techniques such as spin coating, casting, doctor knife application, pressing, curtain coating, etc. The layers are then dried at room temperature or temperatures up to 300° C., preferably 200° C.

The solution of the organic conductor can also be applied in a structured form to the optionally structured base electrode. Suitable methods of producing the structured hole- and/or electron-injecting layers are for example screen printing; rotogravure printing, spraying through structured templates, gravure offset printing, ink ball printing or stamping with structured stamps.

The thickness of the intermediate layer is about 3 to 100 nm, preferably 10 nm to 50 nm.

Organic polymeric binders and/or organic, low molecular weight cross-linking agents can also be added to the solutions of the polymeric organic conductors. Suitable binders are described for example in EP 564 911.

The intermediate layers 3,4 according to the invention can be produced on the base electrode also by electrochemical polymerisation of the monomers corresponding to the polymeric organic conductors. These methods are known and are described for example in EP 339 340.

EXAMPLES

Preparation of the 3,4-polyethylenedioxythiophene Solution (PEDT/PSS Stock Solution).

20 g of free polystyrenesulphonic acid (mol. wt. ca. 40,000), 21.4 g of potassium peroxodisulphate and 50 mg of iron (III) sulphate are added to 2000 ml of water while stirring. 8.0 g of 3,4-ethylenedioxythiophene are added, also while stirring. The solution is then stirred for 24 hours at room temperature. 100 g of anion exchanger (Lewatit MP 62, commercial product from Bayer AG) and 100 g of cation exchanger (Lewatit S 100, commercial product from Bayer AG), both moistened with water, are added and the mixture is stirred for 8 hours.

The ion exchangers are removed by filtration. A solution with a solids content of ca. 1.2 wt. % is obtained, which is ready for use.

Example 1

The following procedure was used to produce an electroluminescent arrangement with PEDT/PSS intermediate layer according to the invention.
a) Cleaning of the ITO
  ITO-coated glass (produced by Balzers) is cut into 20×30 mm size pieces and cleaned in the following steps:
    1. 15 mins in distilled water/Falterol rinsing agent (basic) in an ultrasound bath,
    2. rinse 2×5 mins in each case in fresh distilled water in the ultrasound bath,
    3. 15 mins in ethanol in the ultrasound bath,
    4. 2×15 mins in each case in fresh acetone in the ultrasound bath,
    5. drying on lint-free lens cloths.
b) Application of the PEDT/PSS Layer to the ITO
  2 parts by volume of the filtered PEDT/PSS stock solution are mixed with one part by volume of methanol. About 1 ml of this solution is spread over the cleaned ITO substrate. The supernatant solution is spun off with a spin coater at 1500 revs./min for 30 sec. The film is then dried for 20 minutes at 70° C. in a drying cabinet. The layer thickness is measured with a stylus profilometer (Tencor 200) and is found to be 50 nm.
c) Application of the Electroluminescing Layer
  A second layer, the electroluminescing layer, is applied to the dried PEDT/PSS layer. For this purpose a 1% solution of 7 parts by wt. of poly(vinylcarbazole) (PVK) (Aldrich) and 3 parts by wt. of methine dye (EP-A 699 730) is prepared. The solution is filtered and 1 ml of the solution is spread over the PEDT/PSS. The supernatant solution is spun off with a spin coater at 1000 revs./mins for 30 sec. The sample is then dried for 20 mins. at 500° C. in a vacuum drying cabinet. The overall layer thickness of the sample is then 150 nm.
d) Vacuum Evaporation Coating of the Metal Electrodes and Electrical Contacting
  The sample is mounted in a vacuum evaporation apparatus (Leybold 600). A perforated mask with a hole diameter of 3 mm is placed over the polymeric layer. At a pressure of $10^{-5}$ mbar aluminium is evaporated onto the polymeric layer from a target by means of an electron beam gun. The Al layer thickness is 500 nm. The two electrodes of the organic LED are connected by electrical leads to a voltage source. The positive pole is connected to the ITO electrode, and the negative pole to the Al electrode.
e) Measurement of the Electroluminescence
  Even at low voltages (U=5 volts) a current of 1 mA/cm$^2$ flows through the arrangement. At 8 volts electroluminescence can be detected with a photodiode. At 20 volts the electroluminescence intensity is 50 cd/m$^2$ (Minolta, LS 100).

The control experiment without the PEDT/PSS intermediate layer according to the invention leads to lower EL intensities and to a higher threshold voltage.

Example 2

The following procedure was used to produce an electroluminescing arrangement with PEDT/PSS intermediate layer according to the invention.
a) Cleaning of the ITO
  ITO-coated glass (produced by Balzers) is cut into 20×30 mm size pieces and cleaned in the following steps:
    1. 15 mins in distilled water/Falterol rinsing agent (basic) in an ultrasound bath,
    2. rinse 2×15 mins in each case in fresh distilled water in the ultrasound bath,
    3. 15 mins in ethanol in the ultrasound bath,
    4. 2×15 mins in each case in fresh acetone in the ultrasound bath,
    5. drying on lint-free lens cloths.
b) Application of the PEDT/PSS Layer to the ITO
  2 parts by volume of the filtered PEDT/PSS stock solution are mixed with one part by volume of methanol. About 1 ml of this solution is spread over the cleaned ITO substrate. The supernatant solution is spun off with a spin coater at 1500 revs./min for 30 sec. The film is then dried for 20 minutes at 70° C. in a drying cabinet. The layer thickness is measured with a stylus profilometer (Tencor 200) and is found to be 50 nm.
c) Application of the Electroluminescing Layer
  A second layer, the electroluminescing layer, is applied to the dried PEDT/PSS layer. For this purpose a 1.5% solution of 7 parts by wt. of poly(vinylcarbozole) (PVK) (Aldrich) and 3 parts by wt. of coumerin 6 (Lambda Physics) is prepared. The solution is filtered and 1 ml of the solution is spread over the PEDT/PSS. The supernatant liquid is removed with a spin coater at 1800 revs./mins for 10 sec.
d) Vacuum Evaporation Coating of the Metal Electrodes and Electrical Contacting
  The sample is mounted in a vacuum evaporation apparatus (Leybold 600). A perforated mask with a hole diameter of 3 mm is placed over the polymeric layer. At a pressure of $10^{-5}$ mbar aluminium is evaporated onto the polymeric layer from a target by means of an electron beam gun. The Al layer thickness is 500 nm. The two electrodes of the organic LED are connected by electrical leads to a voltage source. The positive pole is connected to the ITO electrode, and the negative pole to the Al electrode.

e) Measurement of the Electroluminescence

Even at low voltage (U=10 volts) a current of 0.1 mA/cm$^2$ flows through the arrangements. At 8 volts electroluminescence can be detected with a photodiode. At 20 volts the electroluminescence intensity is 10 cd/m$^2$ (Minolta, LS 100).

Example 3

The following procedure was used to prepare an electroluminescing arrangement with PEDT/PSS intermediate layer according to the invention.

a) Cleaning of the ITO

ITO-coated glass (produced by Balzers) is cut into 20×30 mm size pieces and cleaned in the following steps:
1. 15 mins in distilled water/Falterol rinsing agent (basic) in an ultrasound bath,
2. rinse 2×15 mins in each case in fresh distilled water in the ultrasound bath,
3. 15 mins in ethanol in the ultrasound bath,
4. 2×15 mins in each case in fresh acetone in the ultrasound bath,
5. drying on lint-free lens cloths.

b) Application of the PEDT/PSS Layer to the ITO 2 parts by volume of the filtered PEDT/PSS stock solution are mixed with one part by volume of methanol. About 1 ml of this solution is spread over the cleaned ITO substrate. The supernatant solution is spun off with a spin coater at 1500 revs./min for 30 sec. The film is then dried for 20 minutes at 70° C. in a drying cabinet. The layer thickness is measured with a stylus profilometer (Tencor 200) and is found to be 50 nm.

c) Application of the Electroluminescing Layer

A second layer, the electroluminescing layer, is applied to the dried PEDT/PSS layer. For this purpose a 1.5% solution of 7 parts by wt. of poly(vinylcarbazole) (PVK) (Aldrich) and 3 parts by wt. of perylene dye KF 856 (commercial available product from BASF) is prepared. The solution is filtered and 1 ml of the solution is spread over the PEDT/PSS. The supernatant liquid is removed with a spin coater at 1800 revs./mins for 10 sec. The overall layer thickness of the sample is then 140 nm.

d) Vacuum Evaporation Coating of the Metal Electrodes and Electrical Contacting

The sample is mounted in a vacuum evaporation apparatus (Leybold 600). A perforated mask with a hole diameter of 3 mm is placed over the polymeric layer. At a pressure of 10$^{-5}$ mbar aluminium is evaporated onto the polymeric layer from a target by means of an electron beam gun. The Al layer thickness is 500 nm. The two electrodes of the organic LED are connected by electrical leads to a voltage source. The positive pole is connected to the ITO electrode, and the negative pole to the Al electrode.

e) Measurement of the Electroluminescence

Even at low voltages (U=5 volts) a current of 1 mA/cm$^2$ flows through the arrangements. At 4 volts electroluminescence can be detected with a photodiode. At 15 volts the electroluminescence intensity is 30 cd/m$^2$ (Minolta, LS 100).

The control experiment without the PEDT/PSS intermediate layer according to the invention leads to lower EL intensities and to a higher threshold voltage.

Example 4 a) An ITO substrate cleaned according to Example 1a and a 1×2 cm$^2$ size platinum foil are suspended in a solution of 0.8 g of tetramethylammonium tetrafluoroborate and 0.28 g of 3,4-ethylene dioxythiophene in 100 ml of acetonitrile. The glass plate is connected up as the anode. A thin layer of 3,4-polyethylenedioxythiophene as hole-injecting intermediate layer is deposited in 20 sec at a voltage of 2 V and a current of 1.5 mA.

b) A second layer, the electroluminescing layer, is deposited on the dried PEDT layer. For this purpose a 1% solution of 7 parts by wt. of poly(vinylcarbazol) (PVK) (Aldrich) and 3 parts by wt. of methine dye (EP-A 699 730) is prepared. The solution is filtered and 1 ml of the solution is spread over the PEDT. The supernatant solution is removed with a spin coater at 1000 revs./min. for 30 sec. The sample is next dried for 20 minutes at 50° C. in vacuum drying cabinet. The overall layer thickness of the sample is then 150 nm.

c) Vacuum Evaporation Coating of the Metal Electrodes and Electrical Contacting

The sample is mounted in a vacuum evaporation apparatus (Leybold 600): A perforated mask with a hole diameter of 3 mm is placed over the polymeric layer. At a pressure of 10$^{-5}$ mbar aluminium is evaporated onto the polymeric layer from a target by means of an electron beam gun. The Al layer thickness is 500 nm. The two electrodes of the organic LED are connected by electrical leads to a voltage source. The positive pole is connected to the ITO electrode, and the negative pole to the Al electrode.

d) Measurement of the Electroluminescence

Even at low voltages (U=5 volts) a current of 1 mA/cm$^2$ flows through the arrangement. At 4 volts electroluminescence can be detected with a photodiode. At 20 volts the electroluminescence is 10 cd/m$^2$ (Minolta, LS 100).

The control experiment without the PEDT intermediate layer according to the invention leads to lower EL intensities and to a higher threshold voltage.

What is claimed is:

1. Electroluminescing arrangement comprising a hole-injecting layer comprising thiophene of the formula (I)

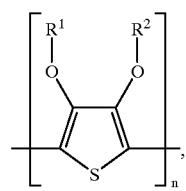

(I)

wherein
R$^1$ and R$^2$ denote, independently of one another, hydrogen, optionally substituted C$_1$–C$_{20}$-alkyl, CH$_2$OH or C$_6$–C$_{14}$-aryl, or
R$^1$ and R$^2$ together denote —(CH$_2$)$_m$—CH$_2$— with m=0 to 12 or C$_6$–C$_{14}$-arylene, and
n is an integer from 5 to 100,
wherein the thiophene of the formula (I) is in cationic form in the presence of a polymeric sulfonic acid or a polymeric carboxylic acid as a polyanion;
an emitter layer; and
a pair of electrodes, wherein at least one of said electrodes is transparent and consists of a material selected from the group consisting of metal oxides and semi-transparent metal films and wherein said hole-injecting layer is directly located on a transparent electrode.

2. Electroluminescing arrangement according to claim 1, wherein the polyanion is selected from the group consisting of polyacrylic acids, polymethacrylic acids, polymaleic acids, polystyrene sulfonic acids and polyvinyl sulfonic acids or their salts, whereby the polymeric carboxylic and sulfonic acids may also be copolymers of vinyl carboxylic and vinyl sulfonic acids with other polymerizable monomers.

3. Electroluminescing arrangement according to claim 1, whereby the polyanion is polystyrene sulfonic acid or the alkali salt thereof.

4. Electroluminescing arrangement according to claim 1, wherein the transparent electrode is an indium-tin oxide electrode.

5. Electroluminescing arrangement according to claim 1, wherein the hole-injecting layer has a thickness of 3 to 100 nm.

6. Electroluminescing arrangement according to claim 1, wherein the hole-injecting layer has a thickness of 10 to 50 nm.

7. A process for producing an electroluminescing arrangement according to claim 1 comprising applying a hole-injecting layer to a transparent electrode.

8. A method of electroluminescing, comprising:

providing an electroluminescing arrangement according to claim 1, and applying a voltage to the arrangement sufficient to cause electroluminescence.

* * * * *